(12) United States Patent
Suzuki et al.

(10) Patent No.: US 6,396,967 B1
(45) Date of Patent: May 28, 2002

(54) OPTOELECTRONIC INTEGRATED CIRCUIT DEVICE

(75) Inventors: Osamu Suzuki; Takayuki Watanabe, both of Kawasaki (JP)

(73) Assignee: Fujitsu, Limited, Kawasaki (JP)

( * ) Notice: Subject to any disclaimer, the term of this patent is extended or adjusted under 35 U.S.C. 154(b) by 0 days.

(21) Appl. No.: 09/528,297

(22) Filed: Mar. 17, 2000

(30) Foreign Application Priority Data

Mar. 18, 1999  (JP) ............................................ 11-074474

(51) Int. Cl.[7] ................................................. G02B 6/12
(52) U.S. Cl. ............................ 385/14; 385/39; 385/131
(58) Field of Search ............................ 385/39, 14, 15, 385/129, 130, 131, 88, 89, 49

(56) References Cited

U.S. PATENT DOCUMENTS

| | | | |
|---|---|---|---|
| 4,894,699 A | | 1/1990 | Hayashi et al. ................ 357/30 |
| 5,061,027 A | * | 10/1991 | Richard ........................ 384/14 |
| 5,101,460 A | * | 3/1992 | Richard ........................ 385/37 |
| 5,200,631 A | * | 4/1993 | Austin et al. .............. 385/14 X |
| 5,408,547 A | * | 4/1995 | Lebby et al. .................. 385/14 |
| 5,652,811 A | * | 7/1997 | Cook et al. ................... 385/14 |
| 5,848,214 A | * | 12/1998 | Haas et al. .................. 385/120 |

FOREIGN PATENT DOCUMENTS

| | | | |
|---|---|---|---|
| DE | 37 27 177 | 11/1993 | ................ 385/14 X |
| DE | 196 52 030 | 6/1998 | ................ 385/14 X |
| JP | 5-67769 | 3/1993 | ................ 385/14 X |
| JP | 6-268194 | 9/1994 | ................ 385/14 X |

OTHER PUBLICATIONS

Copy of German Patent Office Action for corresponding German Patent Application No. 123PAT429–DE dated Jul. 18, 2001 with partial translation.

* cited by examiner

*Primary Examiner*—Brian Healy
(74) *Attorney, Agent, or Firm*—Armstrong, Westerman & Hattori, LLP

(57) ABSTRACT

An optoelectronic integrated circuit device which has less signal damping and signal transmission loss is provided. The optoelectronic integrated circuit device of the present invention includes a first optoelectronic integrated circuit and a second optoelectronic integrated circuit. Each of the first optoelectronic integrated circuit and the second optoelectronic integrated circuit includes an electric circuit unit, an optical output terminal unit, and an optical input terminal unit. The first optoelectronic integrated circuit and the second optoelectronic integrated circuit are arranged so that each optical output terminal unit faces each corresponding optical input terminal unit. In this arrangement, light signal transmission can be carried out between a plurality of optoelectronic integrated circuit devices. Thus, signal damping and transmission loss can be reduced, and signal transmission delay time can be shortened.

15 Claims, 13 Drawing Sheets

OPTOELECTRONIC INTEGRATED CIRCUIT DEVICE

BACKGROUND OF THE INVENTION

1. Field of the Invention

The present invention generally relates to optoelectronic integrated circuit devices, and, more particularly, to an optoelectronic integrated circuit device which performs light signal transmission between integrated circuit devices.

2. Description of the Related Art

In recent years, smaller and higher-performance electronic apparatuses of various types have been produced with the use of highly integrated, high-speed, large-scale integrated circuits (LSI). In a large-scale electric circuit such as computer, LSIs are generally mounted on a multi chip module (MCM) substrate, as shown in FIGS. 1A and 1B.

FIG. 1A is a plan view of MCM substrates 120 mounted onto a system board 110, and FIG. 1B is a side view of the MCM substrates 120.

A plurality of integrated circuit chips 130 are mounted on each of the MCM substrates 120, which electrically connect the integrated circuit chips 130. The MCM substrates 120 are mounted onto the system board 110 by inserting I/O (Input/Output) pins 160 into MCM sockets 150. The MCM substrates 120 are provided with heat radiation fins 140, if necessary. The system board 110 electrically connects the MCM substrates 120 with lead wires. Accordingly, the MCM substrates 120 and the integrated circuit chips 130 are electrically connected to one another, so that the system board 110 can have various functions.

Japanese Laid-Open Patent Application No. 5-67769 discloses such an optoelectronic integrated circuit which performs signal transmission between the integrated circuit chips 130. This optoelectronic integrated circuit is characterized by three-dimensionally arranged substrates to achieve high-speed performance and high density. In this arrangement, the substrates are perpendicular to one anther. The substrates are made of a material through which light signals can pass, so that light signal transmission can be carried out through the substrates.

Even higher speed performance is expected in an electronic apparatus provided with the MCM substrates 120 and the integrated circuit chips 130. However, the connection between the MCM substrates and the integrated circuit chips 130 are electric connection by means of lead wires patterned from a metallic material. Because of this, the signal transmission speed is limited.

As the integrated circuit chips 130 perform at higher speed, proportionally longer transmission delay time is caused in signal transmission between the MCM substrates 120 and the integrated circuit chips 130. As a result, synchronized signal transmission becomes difficult. For instance, in electric signal transmission, a transmission delay time of 70 ps/cm is caused. In FIG. 1B, a signal transmission path 170 between integrated circuit chips 130-1 and 130-2 and a signal transmission path 180 between integrated circuit chips 130-1 and 130-6 have different transmission delay times. Between the signal transmission paths 170 and 180, the difference in transmission delay time becomes too large to ignore in an operation with an operation clock speed of 5 GHz, for instance.

Also, signal damping and transmission loss are caused by the stray capacity and impedance due to the lead wires patterned from a metallic material between the MCM substrates 120 and the integrated circuit chips 130. As a result, signal transmission becomes difficult.

Meanwhile, in an optoelectronic integrated circuit for light signal transmission, light loss cannot be avoided when a light signal passes through substrates, even if the substrates are made of a material that is supposed to cause little light loss. The result is transmission loss. Such transmission loss leads to transmission errors, thereby reducing reliability in the signal transmission.

SUMMARY OF THE INVENTION

A general object of the present invention is to provide optoelectronic integrated circuit devices, in which the above disadvantages are eliminated.

A more specific object of the present invention is to provide an optoelectronic integrated circuit device which has less signal damping and transmission loss.

Another specific object of the present invention is to provide an optoelectronic integrated circuit device in which signal transmission delay time is shorter than in the prior art.

The above objects of the present invention are achieved by an optoelectronic integrated circuit device comprising a first optoelectronic integrated circuit and a second optoelectronic integrated circuit each of which includes an electric circuit unit, an optical output terminal unit having a plurality of light emitting elements connected to the electric circuit unit, and an optical input terminal unit having a plurality of light receiving elements connected to the electric circuit unit. In this optoelectronic integrated circuit device, the first optoelectronic integrated circuit and the second optoelectronic integrated circuit are arranged in such a manner that each optical output terminal unit faces each corresponding optical input terminal unit. In this arrangement, light signal transmission can be carried out between each optical output terminal unit and each corresponding optical input terminal unit of the first optoelectronic integrated circuit and the second optoelectronic integrated circuit.

Accordingly, light signal transmission can be carried out between the first optoelectronic integrated circuit and the second optoelectronic integrated circuit. Also, since each optical output terminal unit faces each corresponding optical input terminal unit, light signal transmission can be carried out without wrong transmission between substrates. Thus, signal damping and transmission loss can be reduced.

The above objects of the present invention are also achieved by a stacked optoelectronic integrated circuit device which comprises a plurality of optoelectronic integrated circuit devices each having the above structure. The plurality of optoelectronic integrated circuit devices are stacked up and bonded to each other via electrode pads.

In the stacked optoelectronic integrated circuit device having this structure, signal transmission can be carried out between the optoelectronic integrated circuit devices via the electrode pads.

The above objects of the present invention are also achieved by a multiple stacked optoelectronic integrated circuit device which comprises a plurality of stacked optoelectronic integrated circuit devices each having the above structure. The plurality of stacked optoelectronic integrated circuit devices are optically connected.

With the multiple stacked optoelectronic integrated circuit device, signal transmission delay time can be shortened, and signal damping and transmission loss can be reduced.

The above and other objects and features of the present invention will become more apparent from the following description taken in conjunction with the accompanying drawings.

DESCRIPTION OF THE PREFERRED EMBODIMENTS

The following is a description of embodiments of the optoelectronic integrated circuit device of the present invention, with reference to the accompanying drawings.

[Optoelectronic Integrated Circuit Device]

Figure 1A:
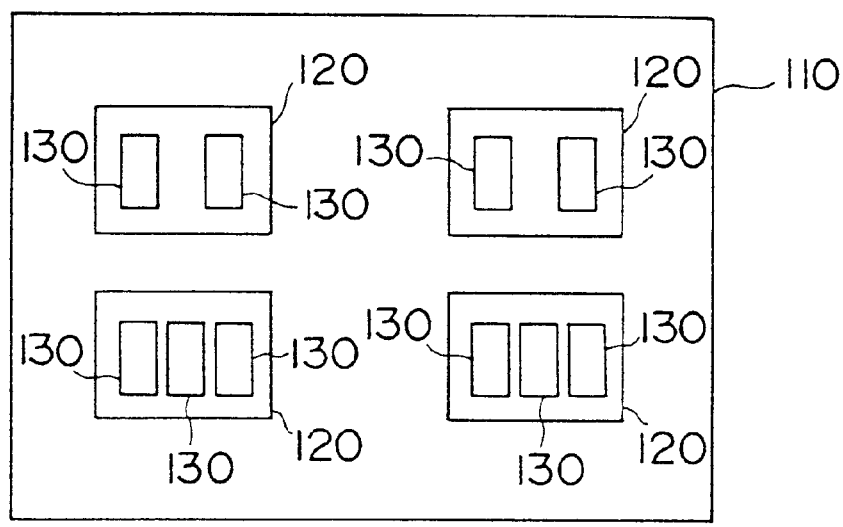
FIG. 1A is a plan view of MCM substrates mounted onto a system board.
Figure 1B:
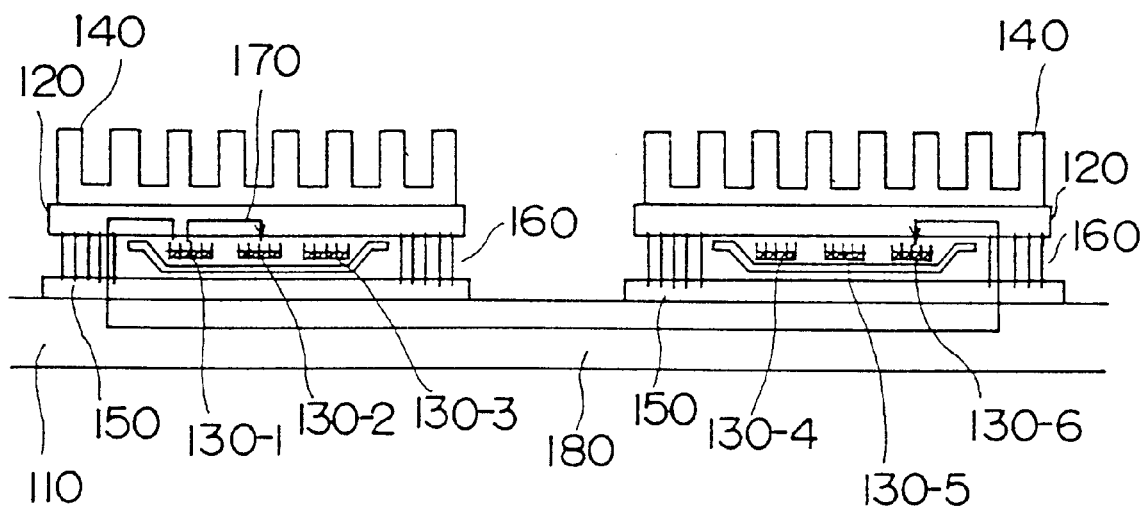
FIG. 1B is a sectional view of the MCM substrates mounted onto the system board.
Figure 2:
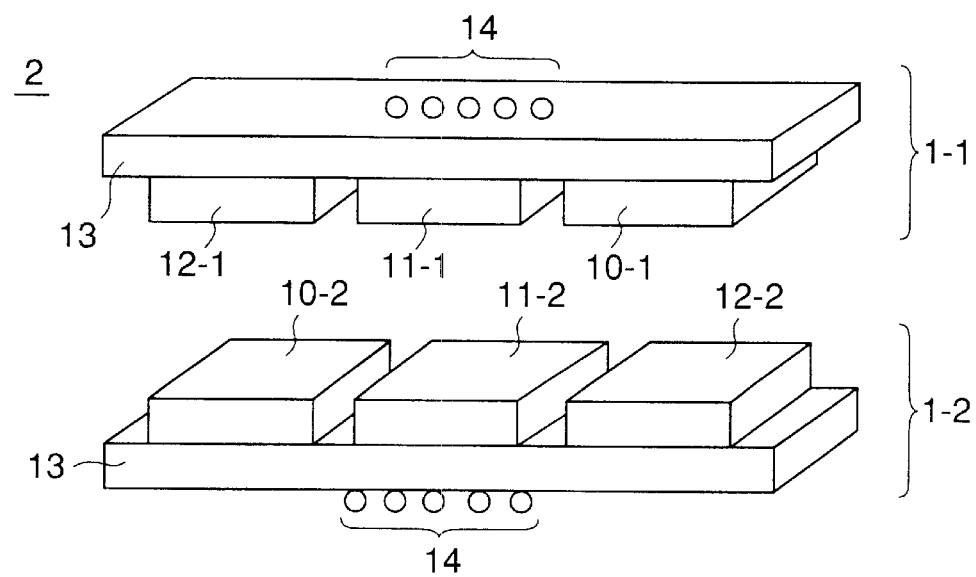
FIG. 2 is a schematic perspective view of one embodiment of an optoelectronic integrated circuit device of the present invention.
Figure 3:
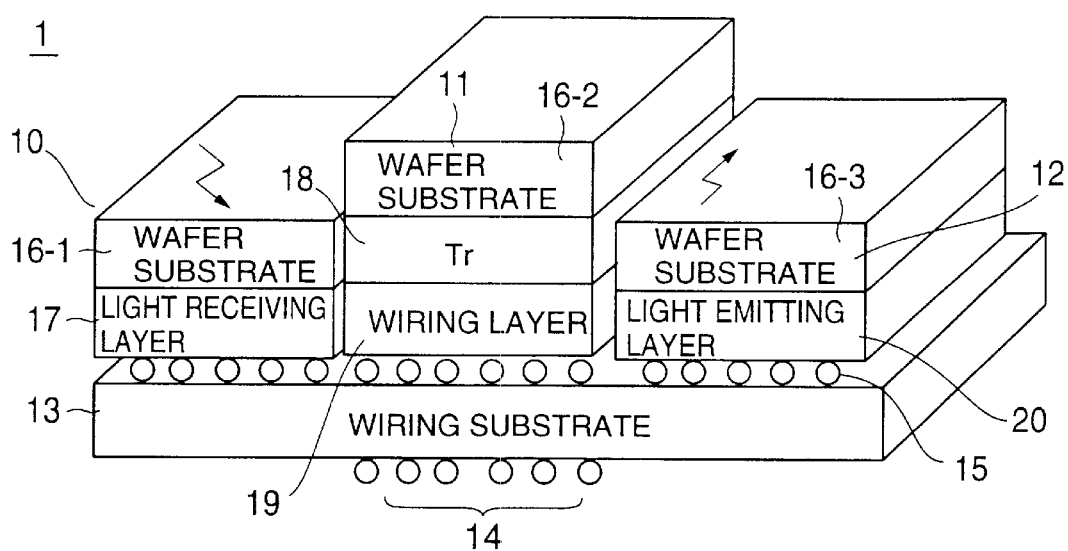
FIG. 3 shows the structure of a first example optoelectronic integrated circuit which is a part of the optoelectronic integrated circuit device of the present invention.

FIG. 2 is a schematic perspective view of one embodiment of the optoelectronic integrated circuit device of the present invention. FIG. 3 shows the structure of a first example optoelectronic integrated circuit which is a part of the optoelectronic integrated circuit device of the present invention.

As shown in FIG. 2, an optoelectronic integrated circuit device 2 comprises a first optoelectronic integrated circuit 1-1 and a second optoelectronic integrated circuit 1-2 facing each other. As shown in FIG. 3, each of the optoelectronic integrated circuits 1-1 and 1-2 comprises an optical input terminal unit 10, an optical output terminal unit 12, an electric circuit unit 11, electrode pads 14, and a wiring substrate 13. The optical input terminal unit 10 comprises a wafer substrate 16-1 and a light receiving layer 17 having light receiving elements in a lattice arrangement. The light receiving elements are located on the side of the wafer substrate 16-1. The light receiving layer 17 is soldered to the wiring substrate 13. The soldered portions are indicated by reference numeral 15 in FIG. 3.

The optical output terminal unit 12 comprises a wafer substrate 16-3 and a light emitting layer 20 having light emitting elements in a lattice arrangement. The light emitting elements are located on the side of the wafer substrate 16-3. The light emitting layer 20 is soldered to the wiring substrate 13. The soldered portions are indicated by the reference numeral 15. The electric circuit unit 11 comprises a wafer substrate 16-2, an electric circuit layer 18 formed by a transistor, for instance, on the side of the wafer substrate 16-2, and a wiring layer 19. The wiring layer 19 is soldered to the wiring substrate 13, and the soldered portions are indicated by the reference numeral 15.

The optical input terminal unit 10 and the optical output terminal unit 12 are electrically connected to the electric circuit unit 11 via the wiring substrate 13. The optical input terminal unit 10 electrically converts a light signal inputted from the other optoelectronic integrated circuit 1-1 or 1-2 into an electric signal, and then supplies the electric signal to the electric circuit unit 11. The optical output terminal 12 receives an electric signal processed by the electric circuit unit 11, and converts the electric signal into a light signal which is outputted to the other optoelectronic integrated circuit 1-1 or 1-2.

The optical input terminal unit 10, the optical output terminal unit 12, and the electric circuit unit 11 are arranged on the same side of the wiring substrate 13, so that the light receiving layer 17 of the optical input terminal unit 10 and the light emitting layer 20 of the optical output terminal unit 12 are located on the same plane.

The wiring substrate 13 is provided with the electrode pads 14 on the opposite side to the surface on which the optical input terminal unit 10, the optical output terminal unit 12, and the electric circuit unit 11 are arranged. The electrode pads 14 can be electrically bonded to the other optoelectronic integrated circuit 1-1 or 1-2.

The optoelectronic integrated circuits 1-1 and 1-2 each having the structure shown in FIG. 3 can transmit light signals between each other, and can be electrically connected to each other via the electrode pads 14.

The two optoelectronic integrated circuits 1-1 and 1-2 facing each other constitute the optoelectronic integrated circuit device 2. The optical output terminal unit 12-1 of the first optoelectronic integrated circuit 1-1 faces the optical input terminal unit 10-2 of the second optoelectronic integrated circuit 1-2. Likewise, the optical input terminal unit 10-1 of the first optoelectronic integrated circuit 1-1 faces the optical output terminal unit 12-2 of the second optoelectronic integrated circuit 1-2.

The optoelectronic integrated circuit device 2 having the above structure can perform light signal transmission between the optoelectronic integrated circuits 1-1 and 1-2.

s[Stacked Optoelectronic Integrated Circuit Device]

Figure 4:
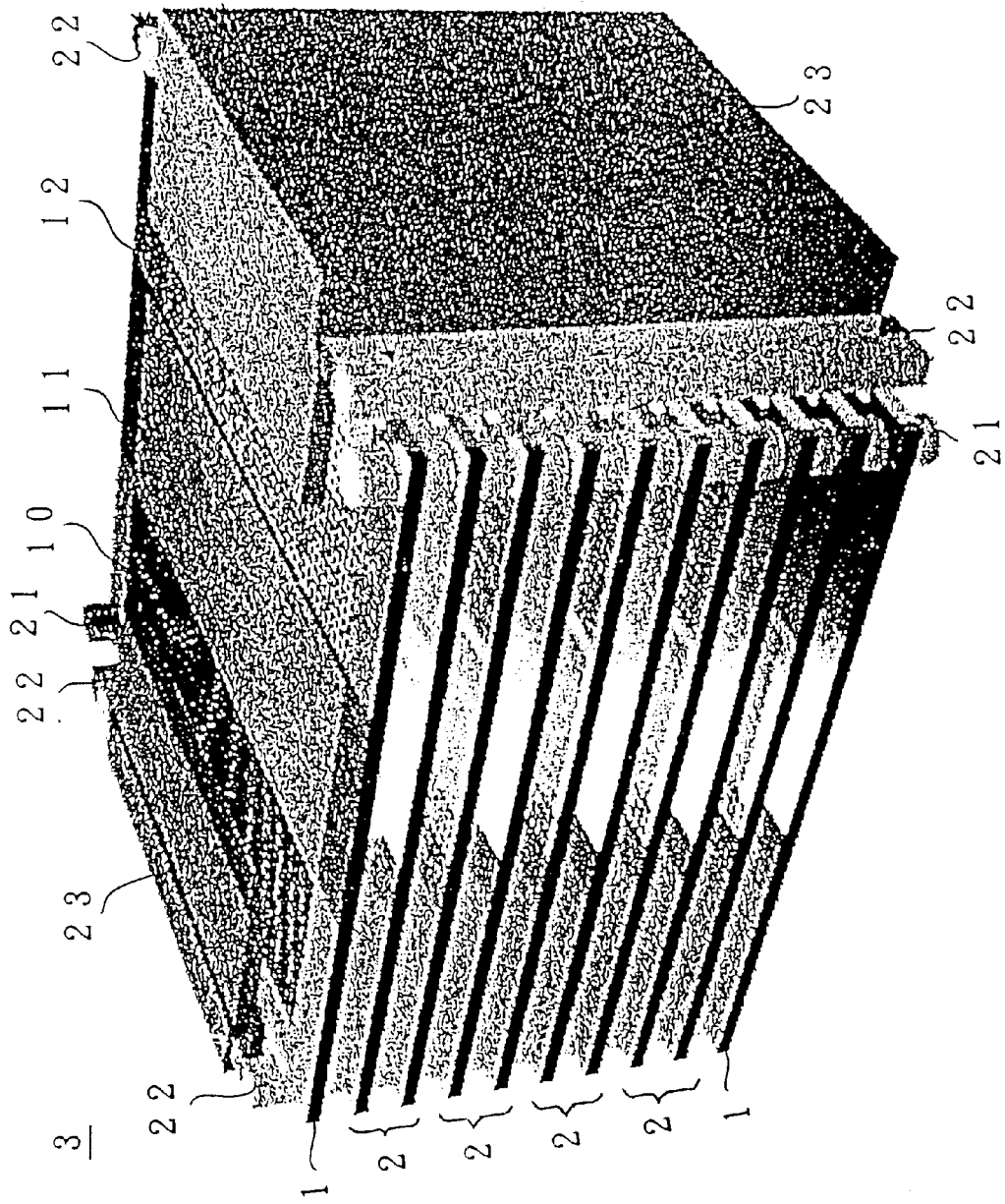
FIG. 4 is a perspective view of one embodiment of a stacked optoelectronic integrated circuit device of the present invention.
Figure 5:
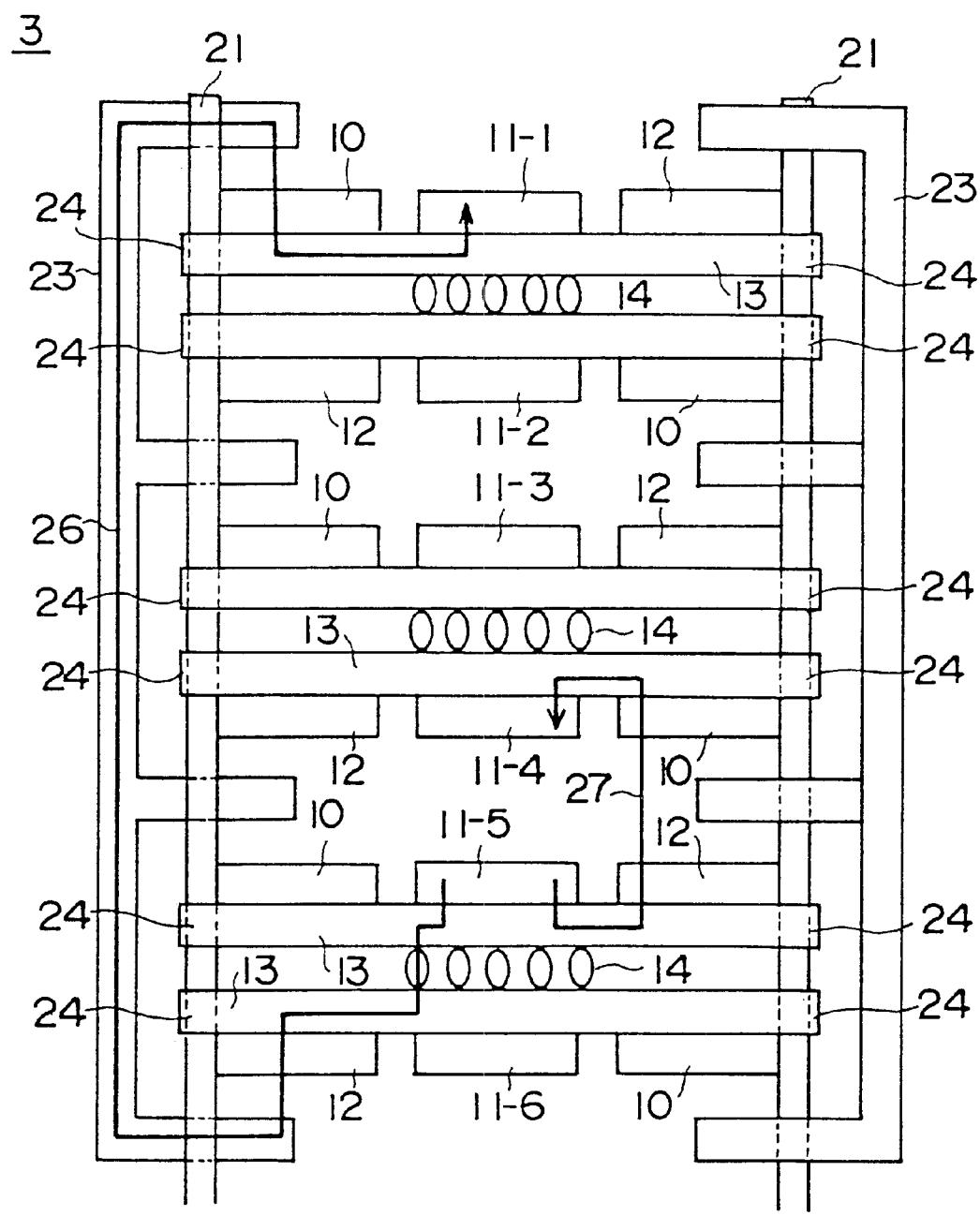
FIG. 5 is a sectional view of the stacked optoelectronic integrated circuit device of FIG. 4.
Figure 6:
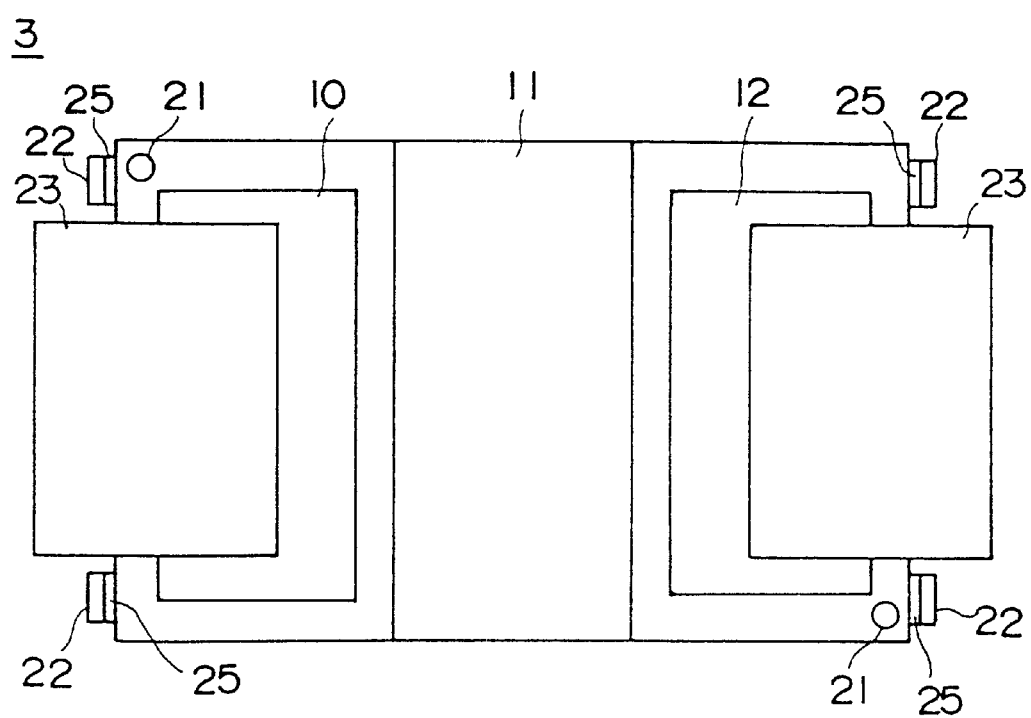
FIG. 6 is a top plan view of the stacked optoelectronic integrated circuit device of FIG. 4.

FIG. 4 is a perspective view of one embodiment of a stacked optoelectronic integrated circuit device of the present invention. FIG. 5 is a sectional view of the stacked optoelectronic integrated circuit device of FIG. 4. FIG. 6 is a plan view of the stacked optoelectronic integrated circuit device of FIG. 4.

As shown in FIGS. 4 to 6, a stacked optoelectronic integrated circuit device 3 comprises a plurality of optoelectronic integrated circuits 2 stacked on one another. The electrode pads 14 of one optoelectronic integrated circuit device 2 are soldered to the electrode pads 14 of another optoelectronic integrated circuit device 2, so that the two optoelectronic integrated circuit devices 2 are electrically connected to each other. An optoelectronic integrated circuit 1 is placed above the highest-stage optoelectronic integrated circuit device 2, and another optoelectronic integrated circuit 1 is placed under the lowest-stage optoelectronic integrated circuit device 2. These optoelectronic integrated circuits 1 are soldered to the optoelectronic integrated circuit devices 2 via the electrode pads 14.

As shown in FIG. 5, positioning holes 24 are formed at the two corners on a diagonal line of each of the optoelectronic integrated circuit devices 2. Positioning pins 21 are inserted into the positioning holes 24, so that the optical axes of the optical input terminal unit 10 and the optical output terminal unit 12 can be positioned to each other. The positioning holes 24 on at least two corners on a diagonal line on each optoelectronic integrated circuit device can fix the optical axis positions. Alternatively, optical axis positioning marks can be formed on the side surfaces of each optoelectronic integrated circuit device 2, and the optical axes can be positioned based on the optical axis positioning marks.

As shown in FIG. 6, each of the optoelectronic integrated circuit devices 2 that constitute the stacked optoelectronic integrated circuit device 3 is provided with power source pads 25 on its side surfaces. The power source pads 25 supply power, and a power supply burr 22 is formed on the each of the power source pads 25. Every optoelectronic integrated circuit device 2 is supplied with power through the power supply burrs 22.

Further, optical waveguides 23 are formed to transmit light signals between all the optoelectronic integrated circuit devices 2 of the stacked optoelectronic integrated circuit device 3. The optical waveguides 23 cover certain parts of the optical input terminal units 10 and the optical output terminal units 12, so as to transmit a light signal from an optical output terminal unit 12 to a desired optical input terminal unit 10.

Referring back to FIG. 5, the transmission paths of light signals will be explained below. First, the transmission path of a light signal transmitted from electric circuit unit 11-5 to electric circuit unit 11-4 is shown as a transmission path 27 in FIG. 5. An electric signal outputted from the electric circuit unit 11-5 is supplied to the corresponding optical output terminal unit 12 via the corresponding wiring substrate 13, and is converted into a light signal. The optical output terminal unit 12 then outputs the light signal to the optical input terminal unit 10 facing the optical output terminal unit 12. The optical input terminal unit 10 converts the light signal into an electric signal, and supplies the electric signal to the electric circuit unit 11-4. In this manner, a light signal is transmitted from the electric circuit unit 11-5 to the electric circuit unit 11-4.

In a case where a light signal is transmitted from the electric circuit unit 11-5 to electric circuit unit 11-1 not adjacent to the electric circuit unit 11-5, the transmission path of the light signal is a transmission path 26 shown in FIG. 5. An electric signal outputted from the electric circuit unit 11-5 is inputted into the optoelectronic integrated circuit 1 having the electric circuit unit 11-6 via the corresponding wiring substrate 13 and the electrode pads 14. The optoelectronic integrated circuit 1 having the electric circuit unit 11-6 supplies the electric signal to the optical output terminal unit 12 via the corresponding wiring substrate 13, and the electric signal is converted into a light signal. The optical output terminal unit 12 outputs the light signal to the adjacent optical wave guide 23. The optical waveguide 23 supplies the light signal to the optical input terminal unit 10 of the optoelectronic integrated circuit 1 having the electric circuit unit 11-1. The optical input terminal unit 10 converts the light signal into an electric signal, and supplies the electric signal to the electric circuit unit 11-1 via the corresponding wiring substrate 13. In this manner, a light signal can be transmitted from the electric circuit unit 11-5 to the electric circuit unit 11-1.

Accordingly, the stacked optoelectronic integrated circuit device 3 having the structure shown in FIGS. 4 to 6 can perform light signal transmission without wrong transmission between substrates of the optoelectronic integrated circuit devices 2 that constitute the stacked optoelectronic integrated circuit device 3. In the light signal transmission, a delay time of 50 ps/cm occurs, which is shorter than a delay time of 70 ps/cm in electric signal transmission.

With the stacked optoelectronic integrated circuit device 3, the signal transmission delay time can be shortened by high-density light signal transmission, and skew and loss in signal transmission can be effectively reduced.

[Stacked Optoelectronic Integrated Circuit Device Provided With Thermal Conduction Plates for Heat Dissipation]

Figure 7:
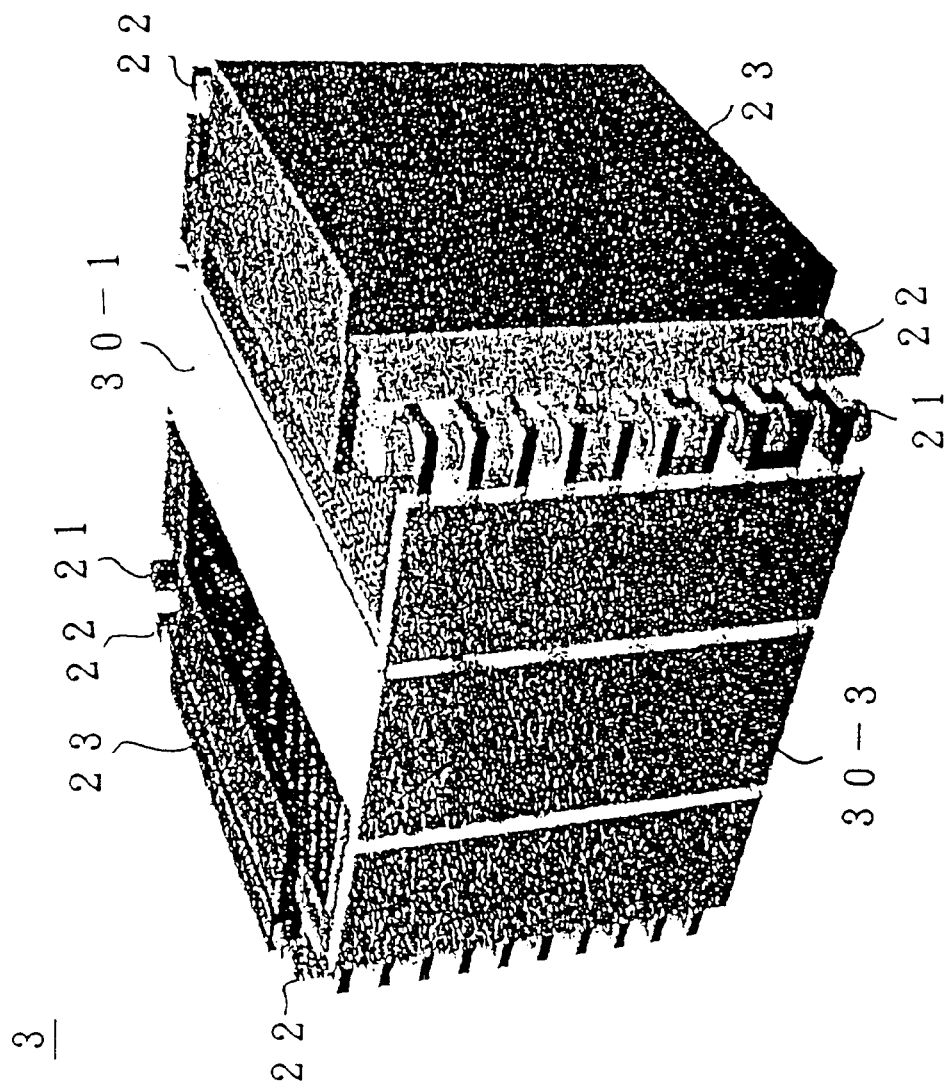
FIG. 7 is a perspective view of one embodiment of the stacked optoelectronic integrated circuit device of the present invention provided with thermal conduction plates for heat dissipation.
Figure 8:
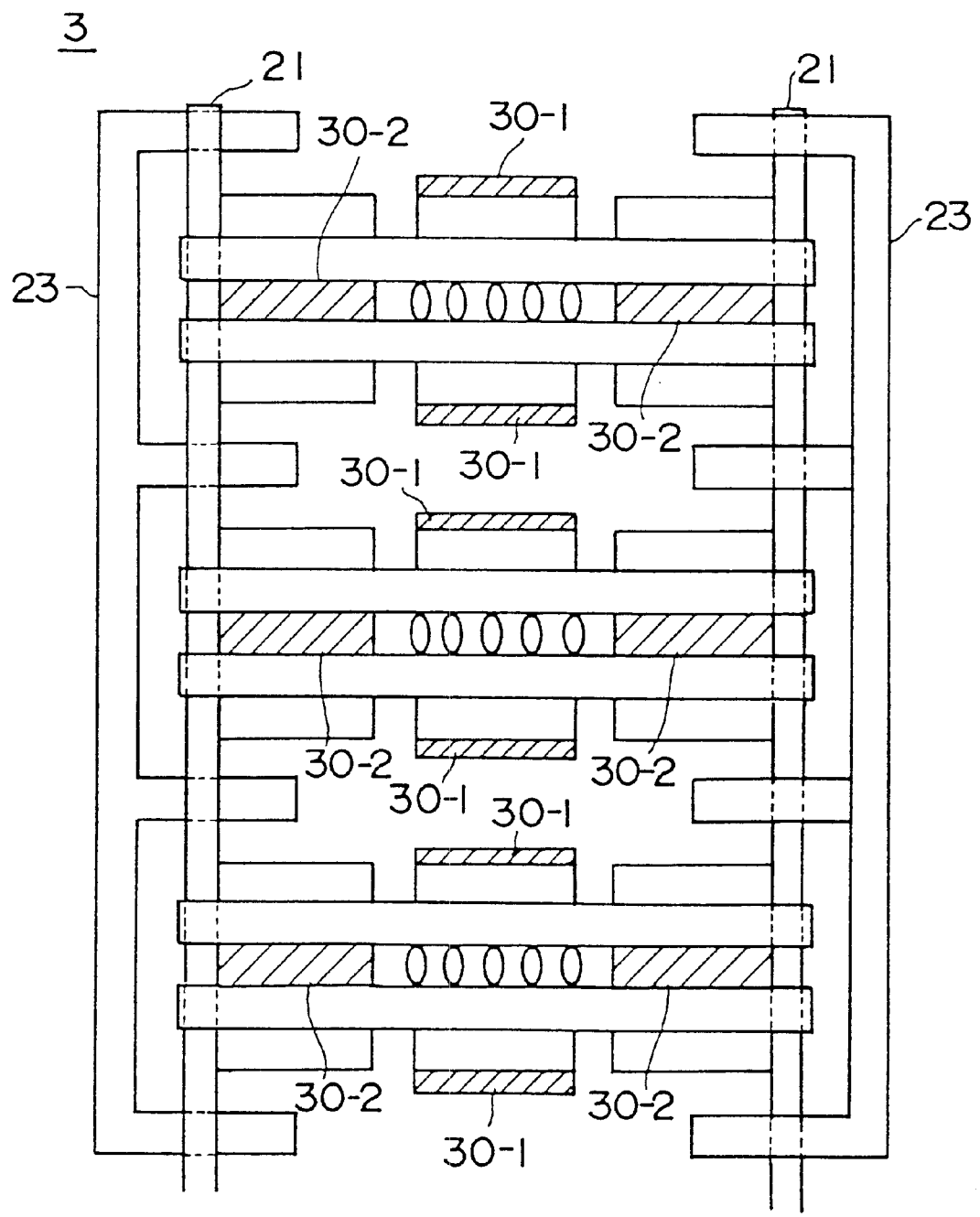
FIG. 8 is a sectional view of the stacked optoelectronic integrated circuit device provided with the thermal conduction plates for heat dissipation of FIG. 7.
Figure 9:
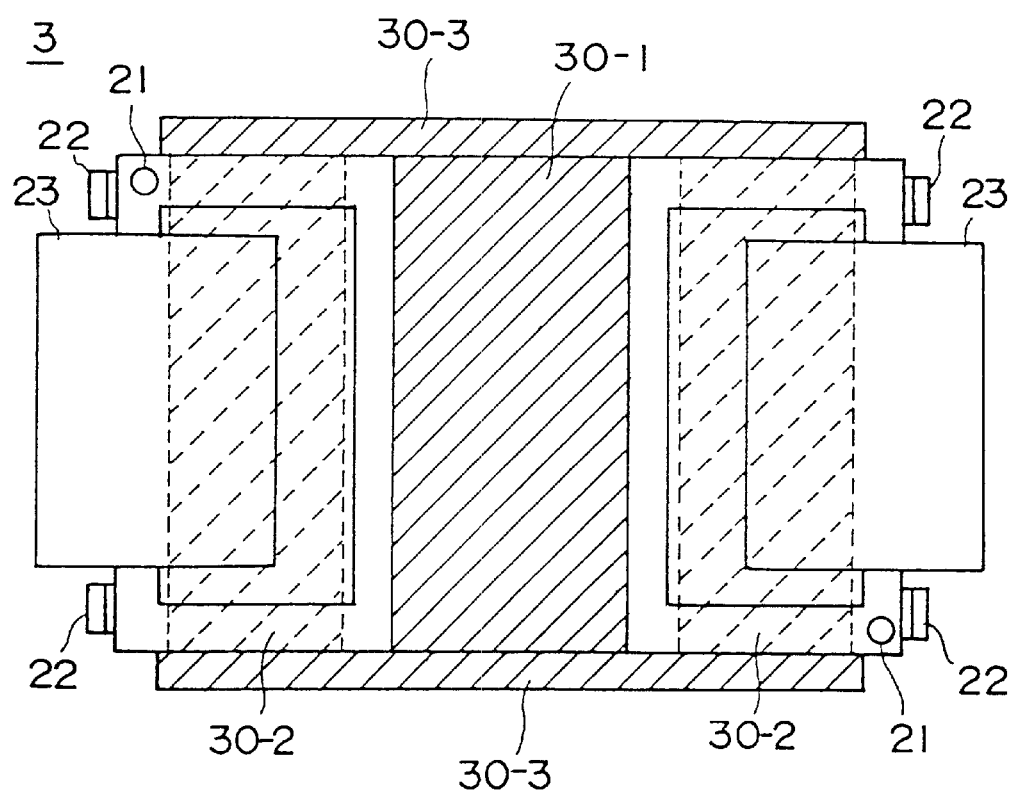
FIG. 9 is a top plan view of the stacked optoelectronic integrated circuit device provided with the thermal conduction plates for heat dissipation of FIG. 7.
Figure 10:
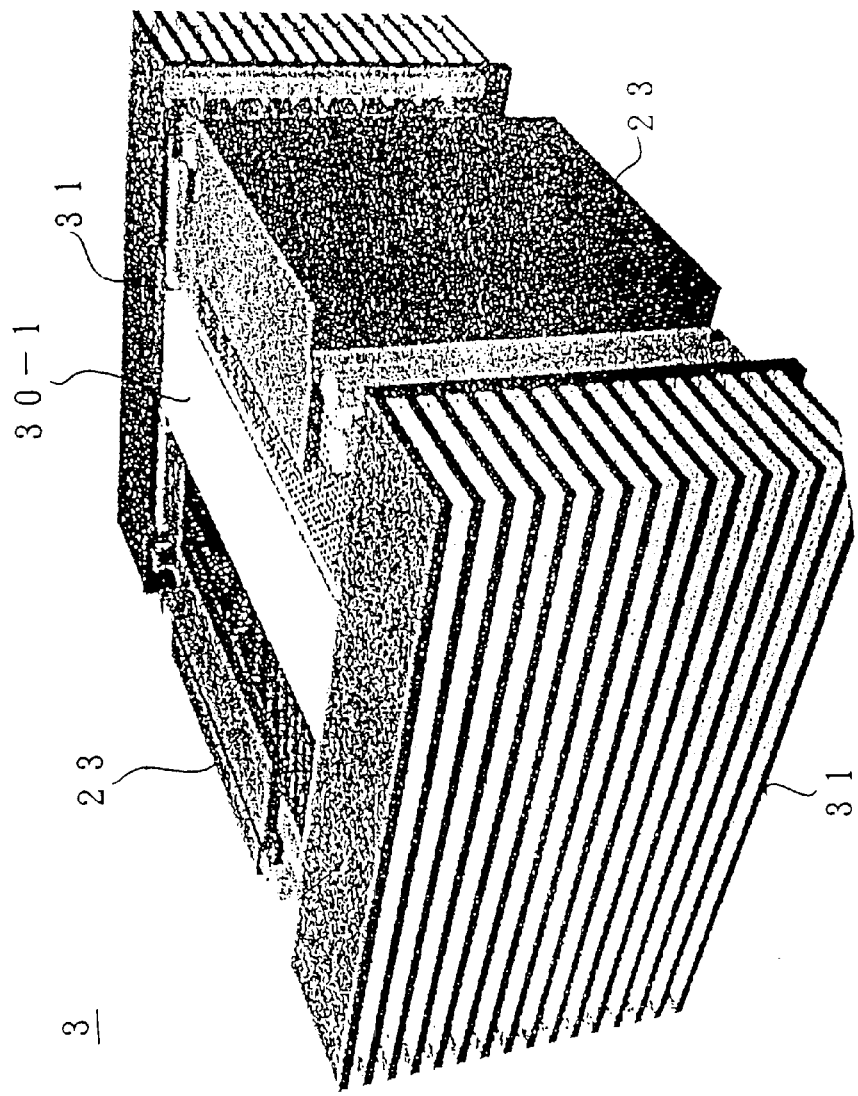
FIG. 10 is a perspective view of another embodiment of the stacked optoelectronic integrated circuit device of the present invention provided with heat radiation fins.

FIG. 7 is a perspective view of one embodiment of the stacked optoelectronic integrated circuit device of the present invention provided with thermal conduction plates for heat dissipation. FIG. 8 is a sectional view of the stacked optoelectronic integrated circuit device provided with the thermal conduction plates for heat dissipation. FIG. 9 is a plan view of the stacked optoelectronic integrated circuit device provided with the thermal conduction plates for heat dissipation. FIG. 10 is a perspective view of another embodiment of the stacked optoelectronic integrated circuit device of the present invention provided with heat radiation fins.

In FIGS. 7 to 9, the stacked optoelectronic integrated circuit device 3 is the same as the stacked optoelectronic integrated circuit device 3 shown in FIGS. 4 to 6, except that it includes thermal conduction plates 30-1 to 30-3 for heat dissipation. More specifically, the stacked optoelectronic integrated circuit device 3 shown in FIGS. 7 to 9 includes the thermal conduction plates 30-1 each in contact with each corresponding electric circuit unit 11 of the optoelectronic integrated circuit devices 2 that constitute the stacked optoelectronic integrated circuit device 3, the thermal conduction plates 30-2 sandwiched between the wiring substrates 13 between the optoelectronic integrated circuit devices 2, and the thermal conduction plates 30-3 disposed on the front and back side surfaces of the stacked optoelectronic integrated circuit device 3.

The thermal conduction plates 30-2 indicated by broken lines in FIG. 9 are located in such positions that do not hinder light signal transmission carried out in the stacked optoelectronic integrated circuit device 3. More specifically, the thermal conduction plates 30-2 are located between the optoelectronic integrated circuit devices 2, and are positioned in line with the optical input terminal units 10 and the optical output terminal units 12.

In the stacked optoelectronic integrated circuit device 3 having the structure shown in FIGS. 7 to 9, efficient heat dissipation can be carried out.

In FIG. 10, the stacked optoelectronic integrated circuit device 3 provided with the thermal conduction plates 30-1 to 30-3 shown in FIGS. 7 to 9 is further provided with heat radiation fins 31.

The stacked optoelectronic integrated circuit device 3 shown in FIG. 10 includes the heat radiation fins 31 on its side surfaces. The heat radiation fins 31 have large surface areas to perform efficient heat dissipation. Each set of the heat radiation fins 31 comprises a flat plate and a plurality of plates extending vertically from the flat plate. The flat plate of each set of the heat radiation fins 31 is in contact with the thermal conduction plates 30-1 to 30-3 for heat dissipation shown in FIGS. 7 to 9.

In the multiple stacked optoelectronic integrated circuit device 3 having the structure shown in FIG. 10, even more efficient heat dissipation can be carried out. As the heat dissipation from the stacked optoelectronic integrated circuit devices 3 becomes more efficient, the stacked optoelectronic integrated circuit devices 3 can become smaller sized and more highly integrated.

[Multiple Stacked Optoelectronic Integrated Circuit Device]

Figure 11:
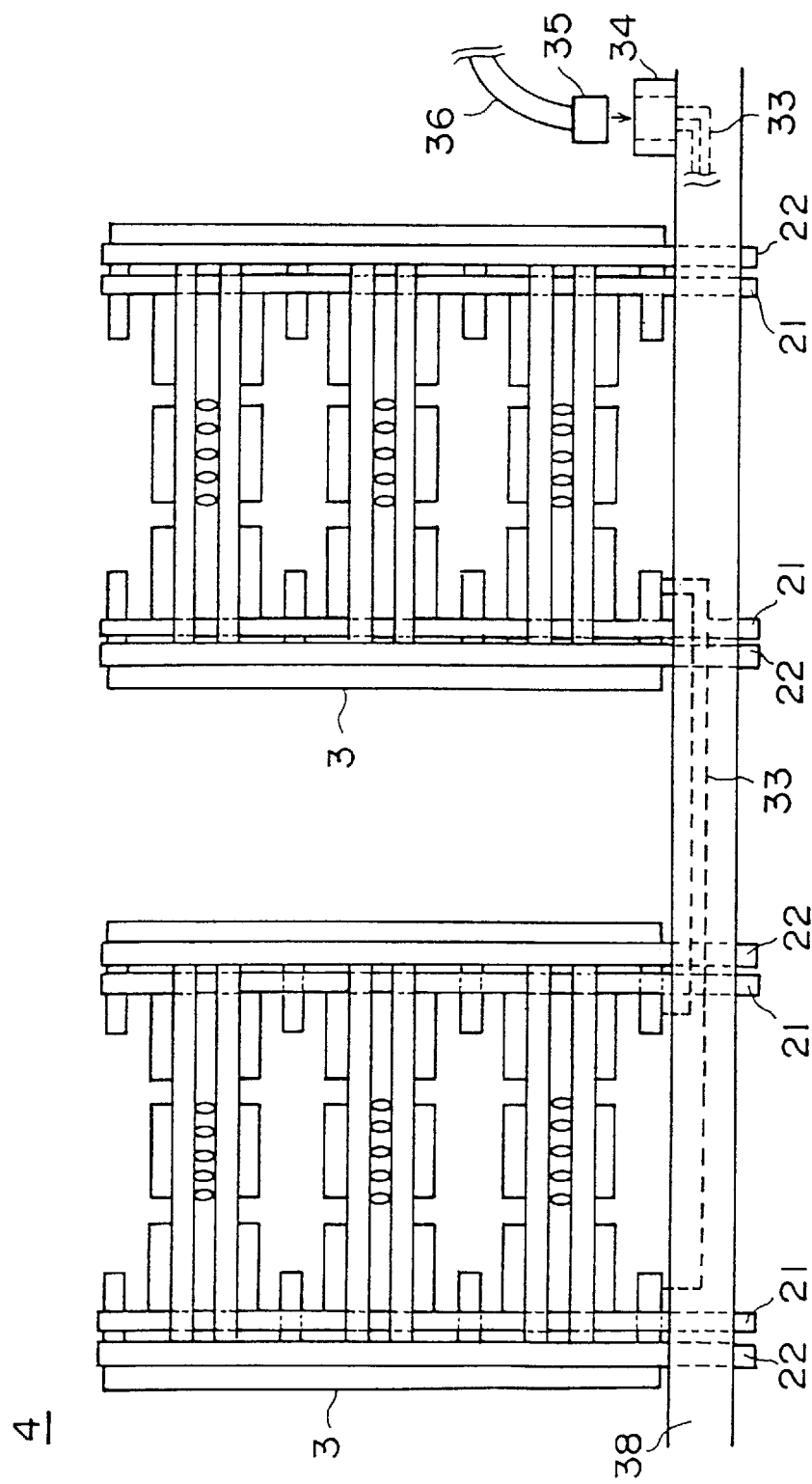
FIG. 11 is a sectional view of one embodiment of a multiple stacked optoelectronic integrated circuit device of the present invention.

FIG. 11 is a sectional view of one embodiment of a multiple stacked optoelectronic integrated circuit device of the present invention. A multiple stacked optoelectronic integrated circuit device 4 shown in FIG. 11 comprises a plurality of stacked optoelectronic integrated circuit devices 3, and a substrate 38 on which the stacked optoelectronic integrated circuit devices 3 are mounted.

In the stacked optoelectronic integrated circuit devices 3 that constitute the multiple stacked optoelectronic integrated circuit device 4, the optical axes are adjusted by the positioning pins 21 at the time of being mounted onto the substrate 38. The stacked optoelectronic integrated circuit devices 3 are supplied with power from the substrate 38 via the power supply burrs 22.

The substrate 38 contains optical waveguides 33 for light signal transmission between the stacked optoelectronic integrated circuit devices 3. The substrate 38 is also provided with an optical connector jack 34 for transmitting a light signal to another substrate. An optical connector plug 35 connected to an optical fiber 36 is also connected to the optical connector jack 34 so as to transmit a light signal to another substrate.

In the multiple stacked optoelectronic integrated circuit device 4 having the structure shown in FIG. 11, light signal transmission between the stacked optoelectronic integrated circuit devices 3 can be carried out. Also, light signal transmission can be carried out between the substrate 38 of the multiple stacked optoelectronic integrated circuit device 4 and the substrate of another multiple stacked optoelectronic integrated circuit device.

[Other Example Structures of Optoelectronic Integrated Circuits]

Figure 12:
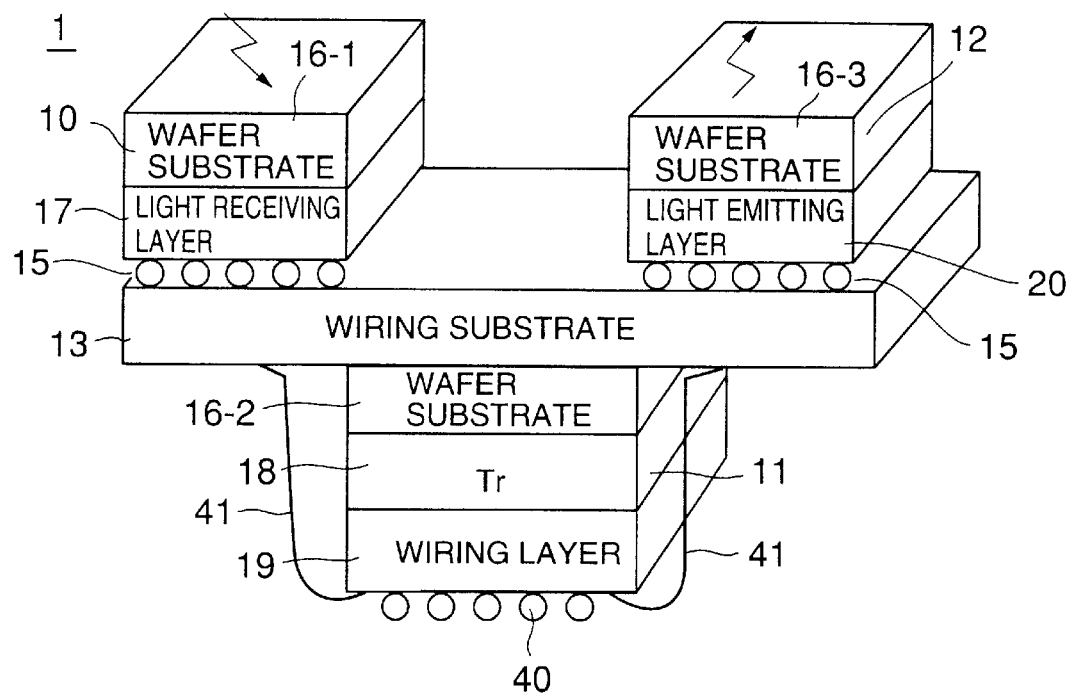
FIG. 12 is a schematic perspective view of a second example optoelectronic integrated circuit of the present invention.

FIG. 12 is a schematic perspective view of a second example optoelectronic integrated circuit of the present invention. An optoelectronic integrated circuit 1 shown in FIG. 12 is substantially the same as the optoelectronic integrated circuit 1 shown in FIG. 3, except the features described below.

As shown in FIG. 12, the optoelectronic integrated circuit 1 comprises an optical input terminal unit 10, an optical output terminal unit 12, an electric circuit unit 11, electrode pads 40, and a wiring substrate 13.

The electric circuit unit 11 comprises a wafer substrate 16-2, an electric circuit layer 18 constituted by a transistor, for instance, and a wiring layer 19. The wafer substrate 16-2 is bonded to the wiring substrate 13. The electric circuit unit 11 is on the opposite surface to the surface of the wiring substrate 13 on which the optical input terminal unit 10 and the optical output terminal unit 12 are mounted. The wiring layer 19 of the electric circuit unit 11 is bonded to the wiring substrate 13 by bonding wires 41, so that the electric circuit unit 11 is electrically connected to the wiring substrate 13, and is also electrically connected to the optical input terminal unit 10 and the optical output terminal unit 12 via the wiring substrate 13. The wiring layer 19 is provided with the electrode pads 40, so that the optoelectronic integrated circuit 1 is connected to another optoelectronic integrated circuit 1 via the electrode pads 40.

As the optoelectronic integrated circuit 1 having the structure shown in FIG. 12 is electrically connected to another optoelectronic integrated circuit 1, light signal transmission can be carried out between the two optoelectronic integrated circuits 1. Also, since the electric circuit units 11 of the two optoelectronic integrated circuits 1 are connected via the electrode pads 40 without the intervention of the wiring substrates 13, the transmission distance of electric signals can be shortened.

Figure 13:
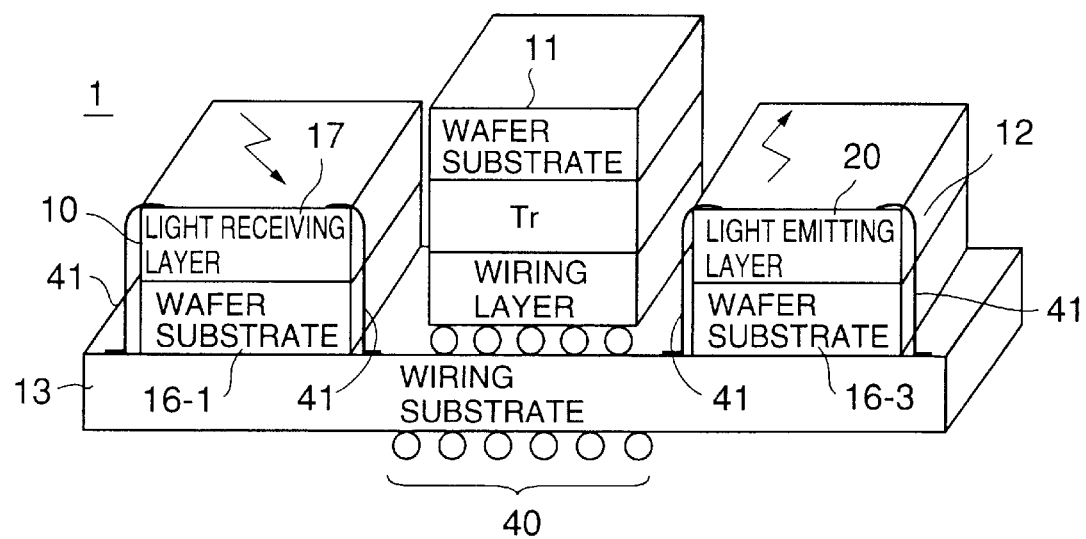
FIG. 13 is a schematic perspective view of a third example optoelectronic integrated circuit of the present invention.

FIG. 13 is a schematic perspective view of a third example optoelectronic integrated circuit of the present invention. An optoelectronic integrated circuit 1 shown in FIG. 13 is substantially the same as the optoelectronic integrated circuit 1 shown in FIG. 3, except the features described below.

As shown in this figure, the optical input terminal unit 10 of this example comprises a wafer substrate 16-1 and a light receiving layer 17 placed on the wafer substrate 16-1 and having a plurality of light receiving elements in a lattice arrangement. The wafer 16-1 is bonded to the wiring substrate 13.

The optical output terminal unit 12 comprises a wafer substrate 16-3 and a light emitting layer 20 placed on the wafer substrate 16-3 and having a plurality of light emitting elements in a lattice arrangement. The light receiving layer 17 of the optical input terminal unit 10 and the light emitting layer 20 of the optical output terminal unit 12 are both bonded to the wiring substrate 13 by bonding wires 41.

As the optoelectronic integrated circuit 1 having the structure shown in FIG. 13 is electrically connected to another optoelectronic integrated circuit 1, light signal transmission can be carried out between the two optoelectronic integrated circuits 1. Also, since the light receiving layer 17 and the light emitting layer 20 can transmit light signals without the intervention of the wafer substrates 16-1 and 16-3, damping of light signals can be reduced.

Figure 14:
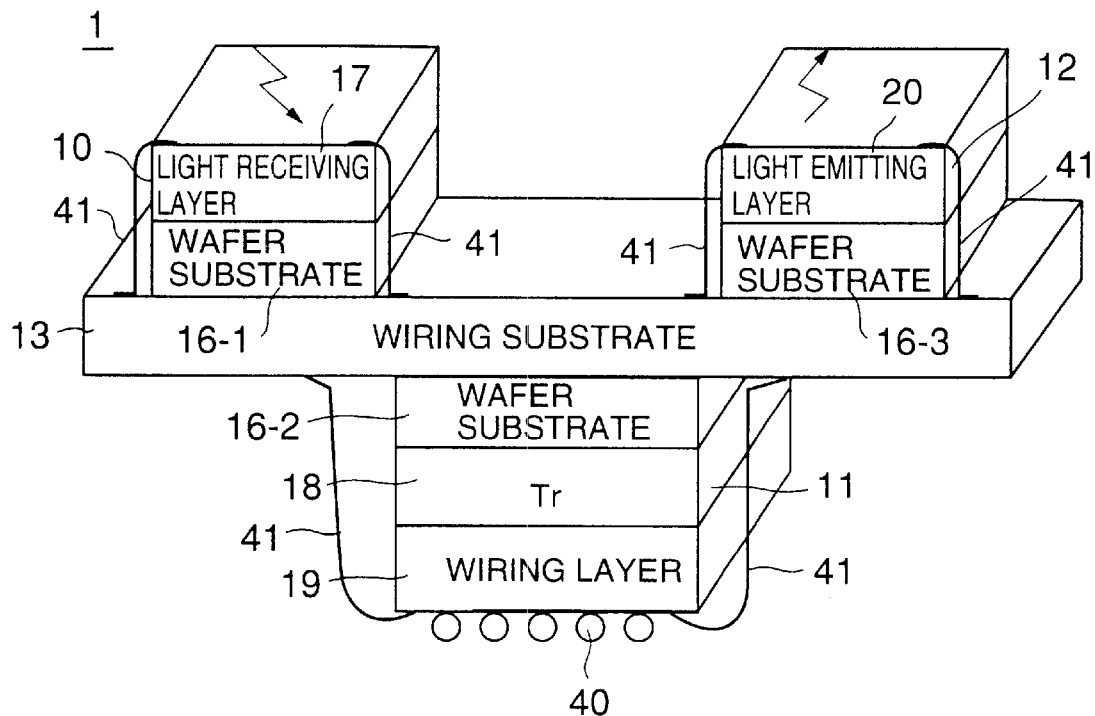
FIG. 14 is a schematic perspective view of a fourth example optoelectronic integrated circuit of the present invention.

FIG. 14 is a schematic perspective view of a fourth example optoelectronic integrated circuit of the present invention. An optoelectronic integrated circuit 1 shown in FIG. 14 is substantially the same as the optoelectronic integrated circuit 1 shown in FIG. 3, except the features described below.

As shown in FIG. 14, the electric circuit unit 11 comprises the wafer substrate 16-2 and the electric circuit layer 18 constituted by a transistor, for instance, and the wiring layer 19, in this order. The wafer substrate 16-2 is bonded to the wiring substrate 13. The wiring layer 19 in the electric circuit unit 11 is provided with the electrode pads 40, and is connected to another optoelectronic integrated circuit 1 via the electrode pads 40. The electric circuit unit 11 is disposed on the opposite surface to the surface of the wiring substrate 13 on which the optical input terminal unit 10 and the optical output terminal unit 12 are placed.

The optical input terminal unit 10 comprises the wafer substrate 16-1, and the light receiving layer 17 placed on the wafer substrate 16-1 and having a plurality of light receiving elements in a lattice arrangement. The wafer substrate 16-1 is bonded to the wiring substrate 13.

The optical output terminal unit 12 comprises the wafer substrate 16-3, the light emitting layer 20 placed on the wafer substrate 16-3 and having a plurality of light emitting elements in a lattice arrangement. The wafer substrate 16-3 is bonded to the wiring substrate 13.

The wiring layer of the electric circuit unit 11 is bonded to the wiring substrate 13 by the bonding wires 41, so that the electric circuit unit 11 is electrically connected to the wiring substrate 13. The light receiving layer 17 of the optical input terminal unit 10 and the light emitting layer 20 of the optical output terminal unit 12 are also bonded to the wiring substrate 13 by the bonding wires 41. Accordingly, the electric circuit unit 11 is electrically connected to the optical input terminal unit 10 and the optical output terminal unit 12, and the optoelectronic integrated circuit 1 of this example can be electrically connected to another optoelectronic integrated circuit 1.

As the optoelectronic integrated circuit 1 having the structure shown in FIG. 14 can be electrically connected to another optoelectronic integrated circuit 1, light signal transmission can be carried out between the two optoelectronic integrated circuits 1. Also, since the wiring layer 19 is electrically connected to the wiring substrate 13 without the intervention of the wafer substrate 16-2, damping of electric signals can be reduced. Further, since the light receiving layer 17 and the light emitting layer 20 can transmit light signals without the intervention of the wafer substrates 16-1 and 16-3, damping of light signals can be reduced.

Figure 15:
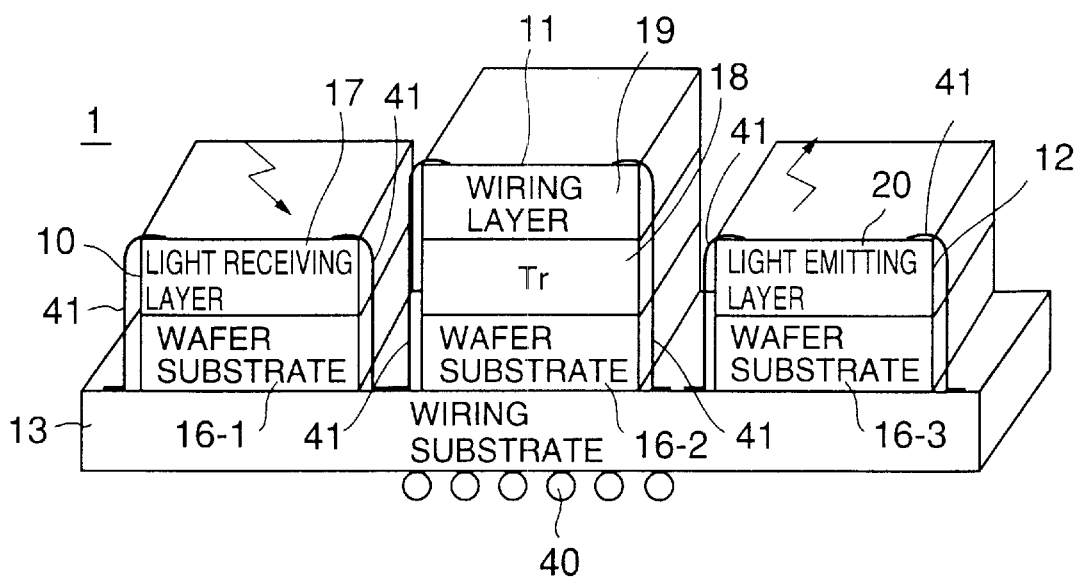
FIG. 15 is a schematic perspective view of a fifth example optoelectronic integrated circuit of the present invention.

FIG. 15 is a schematic perspective view of a fifth example optoelectronic integrated circuit of the present invention. An optoelectronic integrated circuit 1 shown in FIG. 15 is substantially the same as the optoelectronic integrated circuit 1 shown in FIG. 14, except the features described below.

As shown in FIG. 15, the electric circuit unit 11 comprises the wafer substrate 16-2, the electric circuit layer 18 constituted by a transistor, for instance, and the wiring layer 19. The wafer substrate 16-2 is bonded to the wiring substrate 13. The electric circuit unit 11, the optical input terminal unit 10, and the optical output terminal unit 12 are all arranged on the same side of the wiring substrate 13.

The wiring layer 19 of the electric circuit unit 11 is bonded to the wiring substrate 13 by the bonding wires 41, so that the electric circuit unit 11 is electrically connected to the wiring substrate 13. The light receiving layer 17 of the optical input terminal unit 10 and the light emitting layer 20 of the optical output terminal unit 12 are bonded to the wiring substrate 13 by the bonding wires 41. Thus, the electric circuit unit 11 is electrically connected to the optical input terminal unit 10 and the optical output terminal unit 12.

As the optoelectronic integrated circuit 1 having the structure shown in FIG. 15 can be electrically connected to another optoelectronic integrated circuit 1, light signal transmission can be carried out between the two optoelectronic integrated circuits 1. Also, since the wiring layer 19 is electrically connected to the wiring substrate 13 without the intervention of the wafer substrate 16-2, damping of electric signals can be reduced. Further, since the light receiving layer 17 and the light emitting layer 20 can transmit light signals without the intervention of the wafer substrates 16-1 and 16-3, damping of light signals can be reduced.

Figure 16:
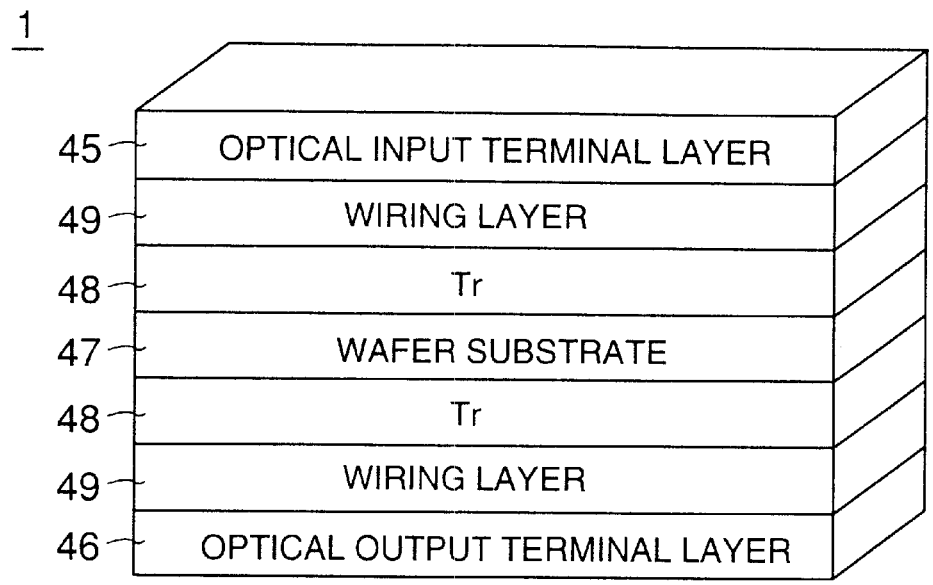
FIG. 16 is a schematic perspective view of a sixth example optoelectronic integrated circuit of the present invention.

FIG. 16 is a schematic perspective view of a sixth example optoelectronic integrated circuit of the present invention. The optoelectronic integrated circuit 1 shown in FIG. 16 comprises an optical input terminal layer 45, an optical output terminal layer 46, a wafer substrate 47, electric circuit layers 48, and wiring layers 49.

The optoelectronic integrated circuit 1 shown in FIG. 16 is structured around the wafer substrate 47, with the electric circuit layers 48 sandwiching the wafer substrate 47. The wiring layers 49 are respectively bonded to the electric circuit layers 48. The optical input terminal layer 45 and the optical output terminal layer 46 are located in the outermost positions. The optical input terminal layer 45 includes a plurality of light receiving elements, and the optical output terminal layer 46 includes a plurality of light emitting elements. The optoelectronic integrated circuit 1 shown in FIG. 16 is thus integrally structured around the wafer substrate 47.

The optoelectronic integrated circuit 1 having the structure shown in FIG. 16 can transmit to and from another optoelectronic integrated circuit 1. Also, since the optoelectronic integrated circuit 1 is integrally formed, the production procedure can be simplified, and the optoelectronic integrated circuit 1 can be made smaller.

Figure 17:
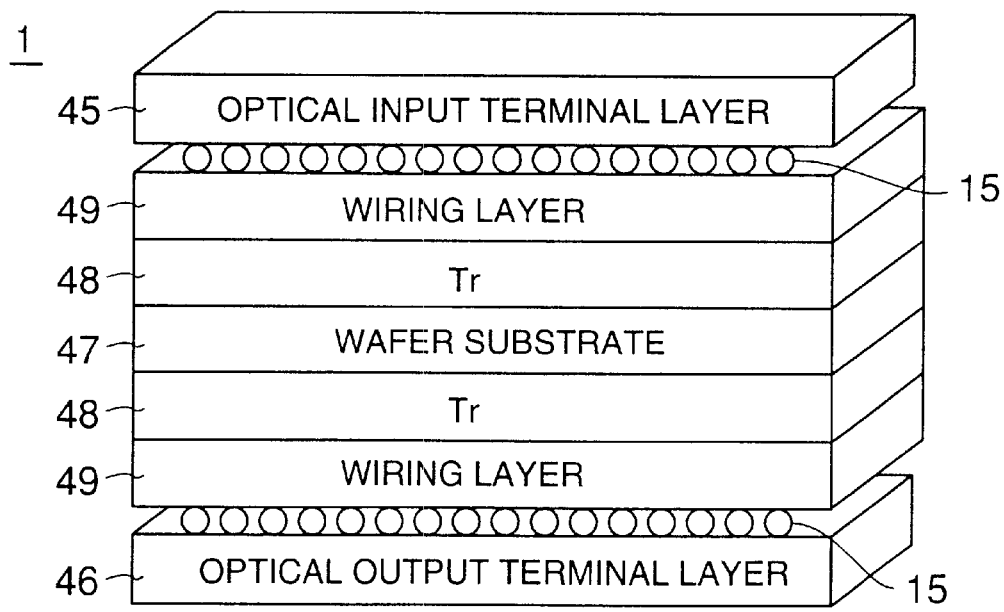
FIG. 17 is a schematic perspective view of a seventh example optoelectronic integrated circuit of the present invention.

FIG. 17 is a schematic perspective view of a seventh example optoelectronic integrated circuit of the present invention. The optoelectronic integrated circuit 1 shown in FIG. 17 is substantially the same as the optoelectronic integrated circuit 1 shown in FIG. 16, except the features described below.

The optoelectronic integrated circuit 1 shown in FIG. 17 comprises the optical input terminal layer 45, the optical output terminal layer 46, the wafer substrate 47, the electric circuit layers 48, and the wiring layers 49. The optoelectronic integrated circuit 1 is structured around the wafer substrate 47, with the electric circuit layers 48 sandwiching the wafer substrate 47. The wiring layers 49 are respectively bonded to the electric circuit layers 48. The optical input terminal layer 45 including a plurality of light receiving elements and the optical output terminal layer 46 including a plurality of light emitting elements are soldered to the wiring layers 49.

Accordingly, the optical input terminal layer 45 and the optical output terminal layer 46 can be formed separately from the part comprising the wafer substrate 47, the electric circuit layers 48, and the wiring layers 49. Thus, the optoelectronic integrated circuit 1 of this example can have increased versatility. Also, the production procedure can be simplified, and the optoelectronic integrated circuit 1 can be made smaller.

The present invention is not limited to the specifically disclosed embodiments, but variations and modifications may be made without departing from the scope of the present invention.

The present application is based on Japanese priority application No. 11-74474, filed on Mar. 18, 1999, the entire contents of which are hereby incorporated by reference.

What is claimed is:

1. An optoelectronic integrated circuit device comprising:
    a first optoelectronic integrated circuit which includes an electric circuit unit, an optical output terminal unit having a plurality of light emitting elements connected to the electric circuit unit, and an optical input terminal unit having a plurality of light receiving elements connected to the electric circuit unit; and
    a second optoelectronic integrated circuit which includes an electric circuit unit, an optical output terminal unit having a plurality of light emitting elements connected to the electric circuit unit, and an optical input terminal unit having a plurality of light receiving elements connected to the electric circuit unit, wherein the first optoelectronic integrated circuit and the second optoelectronic integrated circuit are arranged in such a manner that each optical output terminal unit faces each corresponding optical input terminal unit, so that light signal transmission can be carried out between each optical output terminal unit and each corresponding optical input terminal unit of the first optoelectronic integrated circuit and the second optoelectronic integrated circuit, wherein each of the first optoelectronic integrated circuit and the second optoelectronic integrated circuit comprises the optical output terminal unit including a plurality of light emitting elements in a lattice arrangement, the optical input terminal unit including a plurality of light receiving elements in a lattice arrangement, the electric circuit unit, and electrode pads for inputting and outputting an electric signal, and wherein the plurality of light emitting elements and the plurality of light receiving elements are arranged on one surface of a substrate, while the electrode pads are arranged on a surface opposite to the surface on which the plurality of light emitting elements and the plurality of light receiving elements are arranged.

2. A stacked optoelectronic integrated circuit device comprising a plurality of optoelectronic integrated-circuit devices each comprising:

a first optoelectronic integrated circuit which includes an electric circuit unit, an optical output terminal unit having a plurality of light emitting elements connected to the electric circuit unit, and an optical input terminal unit having a plurality of light receiving elements connected to the electric circuit unit; and a second/optoelectronic integrated circuit which includes an electric circuit unit, an optical output terminal unit having a plurality of light emitting elements connected to the electric circuit unit, and an optical input terminal unit having a plurality of light receiving elements connected to the electric circuit unit, the first optoelectronic integrated circuit and the second optoelectronic integrated circuit being arranged in such a manner that each optical output terminal unit faces each corresponding optical input terminal unit, so that light signal transmission can be carried out between each optical output terminal unit and each corresponding-optical input terminal unit of the first optoelectronic integrated circuit and the second optoelectronic integrated circuit, the plurality of optoelectronic integrated circuit devices being stacked up and bonded to one another by the electrode pads, wherein
the plurality of optoelectronic integrated circuit devices are electrically bonded to one other.

3. The stacked optoelectronic integrated circuit device as claimed in claim 2, further comprising optical waveguides which input a light signal from an optical output terminal unit to an optical input terminal unit.

4. A multiple stacked optoelectronic integrated circuit device comprising a plurality of stacked optoelectronic integrated circuit devices each comprising a plurality of optoelectronic integrated circuit devices each comprising:

a first optoelectronic integrated circuit which includes an electric circuit unit, an optical output terminal unit having a plurality of light emitting elements connected to the electric circuit unit, and an optical input terminal unit having a plurality of light receiving elements connected to the electric circuit unit; and a second optoelectronic integrated circuit which includes an electric circuit unit, an optical output terminal unit having a plurality of light emitting elements connected to the electric circuit unit, and an optical input terminal unit having a plurality of light receiving elements connected to the electric circuit unit, the first optoelectronic integrated circuit and the second optoelectronic integrated circuit being arranged in such a manner that each optical output terminal unit faces each corresponding optical input terminal unit, so that light signal transmission can be carried out between each optical output terminal unit and each corresponding optical input terminal unit of the first optoelectronic integrated circuit and the second optoelectronic integrated circuit, the plurality of optoelectronic integrated circuit devices being stacked up and bonded to one another by the electrode pads, the plurality of optoelectronic integrated circuit devices being electrically bonded to one other, wherein
the plurality of stacked optoelectronic integrated circuit devices are optically connected.

5. The stacked optoelectronic integrated circuit device as claimed in claim 3, wherein each of the optoelectronic integrated circuits is provided with optical axis positioning marks and optical axis positioning holes at least at two corners, with positioning pins being inserted into the optical axis positioning holes.

6. The optoelectronic integrated circuit device as claimed in claim 1, further comprising power source pads for supplying-power formed on side surfaces of each of the optoelectronic integrated circuits.

7. The stacked optoelectronic integrated circuit device as claimed in claim 3, further comprising:

thermal conduction plates for heat dissipation interposed between the optoelectronic integrated circuit devices and disposed in contact with each electric circuit unit; and heat radiation fins which are placed in contact with the thermal conduction plates.

8. The stacked optoelectronic integrated circuit device as claimed in claim 3, wherein the power source pads disposed on side surfaces of each of the optoelectronic integrated circuits are each provided with a power supply burr for supplying power to each corresponding power source pad.

9. The multiple stacked optoelectronic integrated circuit device as claimed in claim 5, wherein the multiple stacked optoelectronic integrated circuit device is arranged on-a substrate which comprises:

an optical waveguide which performs signal transmission between the stacked optoelectronic integrated circuits;

a power source line which supplies power to the stacked optoelectronic integrated circuits; and an interface unit which interfaces with another substrate.

10. An optoelectronic integrated circuit device comprising:

a first optoelectronic integrated circuit which includes an electric circuit unit, an optical output terminal unit having a plurality of light emitting elements connected to the electric circuit unit, and an optical input terminal unit having a plurality of light receiving elements connected to the electric circuit unit; and a second optoelectronic integrated circuit which includes an electric circuit unit, an optical output terminal unit having a plurality of light emitting elements connected to the electric circuit unit, and an optical input terminal unit having a plurality of light receiving elements connected to the electric circuit unit, wherein the first optoelectronic integrated circuit and the second optoelectronic integrated circuit are arranged in such a manner that each optical output terminal unit faces each corresponding optical input terminal unit, so that light signal transmission can be carried out between each optical output terminal unit and each corresponding optical input terminal unit of the first optoelectronic integrated circuit and the second optoelectronic integrated circuit, and wherein each of the first optoelectronic integrated circuit and the second optoelectronic integrated circuit comprises:

an optical output terminal layer which includes a plurality of light emitting elements in a lattice arrangement;

an optical input terminal layer which includes a plurality of light receiving elements in a lattice arrangement; and an electric circuit layer sandwiched by the optical output terminal layer and the optical input terminal layer.

11. The optoelectronic integrated circuit device as claimed in claim 10, wherein each optical output terminal layer and each optical input terminal layer are soldered to each corresponding electric circuit layer.

12. The optoelectronic integrated circuit device as claimed in claim 1, wherein each electric circuit unit is disposed on the same side of a substrate as each corresponding optical output terminal output unit and each corresponding optical input terminal unit.

13. The optoelectronic integrated circuit device as claimed in claim 12, wherein the electric circuit units, the optical output terminal units, and the optical input terminal units are each electrically connected to the substrate by wire bonding.

14. The optoelectronic integrated circuit device as claimed in claim 1, wherein each electric circuit unit is disposed on an opposite side of a substrate from each corresponding output terminal unit and each corresponding optical input terminal unit.

15. The optoelectronic integrated circuit device as claimed in claim 14, wherein the electric circuit units, the optical output terminal units, and the optical input terminal units are each electrically connected to the substrate by wire bonding.

* * * * *